United States Patent
Mazumder (10) Patent No.: US 9,530,473 B2
(45) Date of Patent: Dec. 27, 2016

(54) APPARATUSES AND METHODS FOR TIMING PROVISION OF A COMMAND TO INPUT CIRCUITRY

(71) Applicant: Micron Technology, Inc., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/285,476

(22) Filed: May 22, 2014

(65) Prior Publication Data

US 2015/0340072 A1 Nov. 26, 2015

(51) Int. Cl.
*G11C 7/22* (2006.01)
*G11C 7/10* (2006.01)

(52) U.S. Cl.
CPC ............... *G11C 7/222* (2013.01); *G11C 7/109* (2013.01); *G11C 7/1066* (2013.01); *G11C 7/1093* (2013.01); *G11C 7/225* (2013.01); *G11C 7/106* (2013.01); *G11C 7/1084* (2013.01)

(58) Field of Classification Search
CPC ....... G11C 7/222; G11C 7/106; G11C 7/1084; G11C 7/225; G11C 7/109; G11C 7/1093; G11C 7/1066
See application file for complete search history.

(56) References Cited

U.S. PATENT DOCUMENTS

| | | | |
|---|---|---|---|
| 5,004,933 A | 4/1991 | Widener | |
| 6,111,810 A | 8/2000 | Fujita | |
| 6,219,384 B1 | 4/2001 | Kliza et al. | |
| 6,260,128 B1 | 7/2001 | Ohshima et al. | |
| 6,275,077 B1 | 8/2001 | Tobin et al. | |
| 6,327,318 B1 | 12/2001 | Bhullar et al. | |
| 6,424,592 B1 | 7/2002 | Maruyama | |
| 6,438,055 B1 | 8/2002 | Taguchi et al. | |

(Continued)

FOREIGN PATENT DOCUMENTS

| | | |
|---|---|---|
| CN | 101752009 A | 6/2010 |
| JP | 2013-222997 A | 10/2013 |

OTHER PUBLICATIONS

Interfacing DDR SDRAM with Stratix II Devices, Version 3.2, Altera Corp, Sep. 2008.

(Continued)

*Primary Examiner* — J. H. Hur
(74) *Attorney, Agent, or Firm* — Dorsey & Whitney LLP (57) ABSTRACT

An apparatus or method may include provision of a command to a data block. An example apparatus includes a command circuit configured to provide a command signal in an internal clock time domain based at least in part on a memory access command received in an external clock time domain. The example apparatus further includes a command path delay configured to delay the command signal. The example apparatus further includes a data strobe generator circuit configured to receive the command signal and a data strobe signal. A plurality of clock edges of the data strobe signal correspond to received data bits associated with the memory access command. The data strobe generator circuit is configured to control input circuitry to capture the data associated with the memory access command based at least in part on the data strobe signal and the command signal.

22 Claims, 5 Drawing Sheets

(56) References Cited

U.S. PATENT DOCUMENTS

| | | |
|---|---|---|
| 6,459,313 B1 | 10/2002 | Godbee et al. |
| 6,489,823 B2 | 12/2002 | Iwamoto |
| 6,510,095 B1 | 1/2003 | Matsuzaki et al. |
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,580,321 B2 | 8/2009 | Fujisawa et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,644,096 B2 | 2/2014 | Bringivijayaraghavan |
| 8,717,078 B2 | 5/2014 | Idgunji et al. |
| 8,732,509 B2 | 5/2014 | Kwak |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 2001/0015924 A1 | 8/2001 | Arimoto et al. |
| 2002/0057624 A1 | 5/2002 | Manning |
| 2003/0117864 A1 | 6/2003 | Hampel et al. |
| 2003/0147299 A1* | 8/2003 | Setogawa ............ G11C 7/106 365/189.05 |
| 2003/0161210 A1* | 8/2003 | Acharya ............ G11C 7/1072 365/233.1 |
| 2005/0024107 A1 | 2/2005 | Takai et al. |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1* | 5/2008 | Kim ............ G11C 7/1078 713/500 |
| 2008/0137471 A1 | 6/2008 | Schnell et al. |
| 2008/0144423 A1 | 6/2008 | Kwak |
| 2008/0232179 A1 | 9/2008 | Kwak |
| 2008/0232180 A1* | 9/2008 | Kim ............ G11C 7/1051 365/194 |
| 2008/0253205 A1* | 10/2008 | Park ............ G11C 29/12015 365/189.16 |
| 2009/0041104 A1 | 2/2009 | Bogdan |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0327926 A1 | 12/2010 | Takahashi |
| 2011/0047319 A1* | 2/2011 | Jeon ............ G06F 13/4243 711/103 |
| 2011/0055671 A1 | 3/2011 | Kim et al. |
| 2011/0057697 A1 | 3/2011 | Miyano |
| 2011/0102039 A1 | 5/2011 | Shin |
| 2011/0228625 A1 | 9/2011 | Bringivijayaraghavan |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002320 A1 | 1/2013 | Lin et al. |
| 2013/0141994 A1 | 6/2013 | Ito et al. |
| 2013/0194013 A1 | 8/2013 | Kwak |

(56) References Cited

U.S. PATENT DOCUMENTS

| | | |
|---|---|---|
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0258764 A1 | 9/2014 | Kwak |
| 2014/0293719 A1 | 10/2014 | Jung |
| 2015/0156009 A1 | 6/2015 | Bogdan |
| 2015/0170725 A1 | 6/2015 | Kwak |
| 2015/0235691 A1 | 8/2015 | Kwak |
| 2016/0056807 A1 | 2/2016 | Neidengard et al. |

OTHER PUBLICATIONS

Lee, "How to Implement DDR SGRAM in Graphic System", Samsung Electric, 4Q1998 (Oct.-Dec. 1998).

U.S. Appl. No. 14/698,550, entitled "Methods and Apparatuses Including Command Latency Control Circuit", filed Apr. 28, 2015.

U.S. Appl. No. 15/139,102, entitled "Methods and Apparatuses Including Command Delay Adjustment Circuit", filed Apr. 26, 2016.

U.S. Appl. No. 15/139,120, entitled "Apparatuses and Methods for Adjusting a Delay of a Command Signal Path", filed Apr. 26, 2016.

U.S. Appl. No. 15/243,651, entitled "Apparatuses and Methods for Adjusting Delay of Command Signal Path", filed Aug. 22, 2016.

\* cited by examiner

APPARATUSES AND METHODS FOR TIMING PROVISION OF A COMMAND TO INPUT CIRCUITRY

BACKGROUND OF THE DISCLOSURE

In semiconductor memory, proper operation of the memory is based on the correct timing of various internal command and clock signals. For example, in writing data to the memory, internal clock signals that clock data block circuitry to provide (e.g. output) input to the write command may need to be provided substantially concurrently with receipt of write data at input circuitry in order for the data block circuitry to properly capture the write data. If the timing of the internal write command signal is not such that the data block circuitry is enabled at the time the data strobe (DQS) signal clocks the data block circuitry to capture the write data at an expected time, incorrect or incomplete write data may be inadvertently captured and written to the memory.

Moreover, as known, a "latency" may be programmed to set a time, typically in numbers of clock periods (tCK), between receipt of a write command by the memory and receipt of the write data at the memory. The latency may be programmed by a user of the memory to accommodate clock signals of different frequencies (i.e., different clock periods). Other examples of commands that may require the correct timing of internal clock signals and the command for proper operation include, for example, read commands and on-die termination enable commands.

Complicating the providing of correctly timed internal clock and command signals is the relatively high frequency of clock signals. For example, clock signals can exceed 1 GHz. Further complicating the matter is that multi-data rate memories may receive data at a rate higher than the clock signal. The timing domains of command and clock signals may need to be crossed in order to maintain proper timing. An example of a multi-data rate memory is one that receives write data at a rate twice that of the clock frequency, such as receiving data synchronized with clock edges of the clock signal.

In one example, a data strobe signal DQS may be used to time receipt of data, and the timing of the command may be received according to timing of an external clock signal. The timing of the DQS signal could be aligned to the external clock rise/fall edges or it could lag/lead the clock-edges by a certain percentage of an external clock signal clock cycle (e.g., tDQSSmin/max variation). For example, in DDR3 architectures, tDQSSmin/max variation may be up to 25% of tCK. Thus, the range of variation of the DQS signal is 0.5*tCK wide from 0.25*tCK earlier than the external clock to 0.25*tCK later than the external clock, adding a further complication to achieving proper timing.

An example conventional approach of timing internal command to enable capture of data via the DQS signal is delaying the write command through delays such that the DQS signal and the write command have the same propagation delay to the input circuitry. However, the propagation delay of the various internal propagation paths can often vary due to process, voltage, and temperature conditions. For DQS and command paths having relatively long propagation delay or additional delay circuitry, the variations due to operating conditions may negatively affect the timing of the internal signals to such a degree that the memory does not operate properly. Additionally, increasing a clock frequency enhances the negatively affected timing, as a margin for error becomes smaller.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
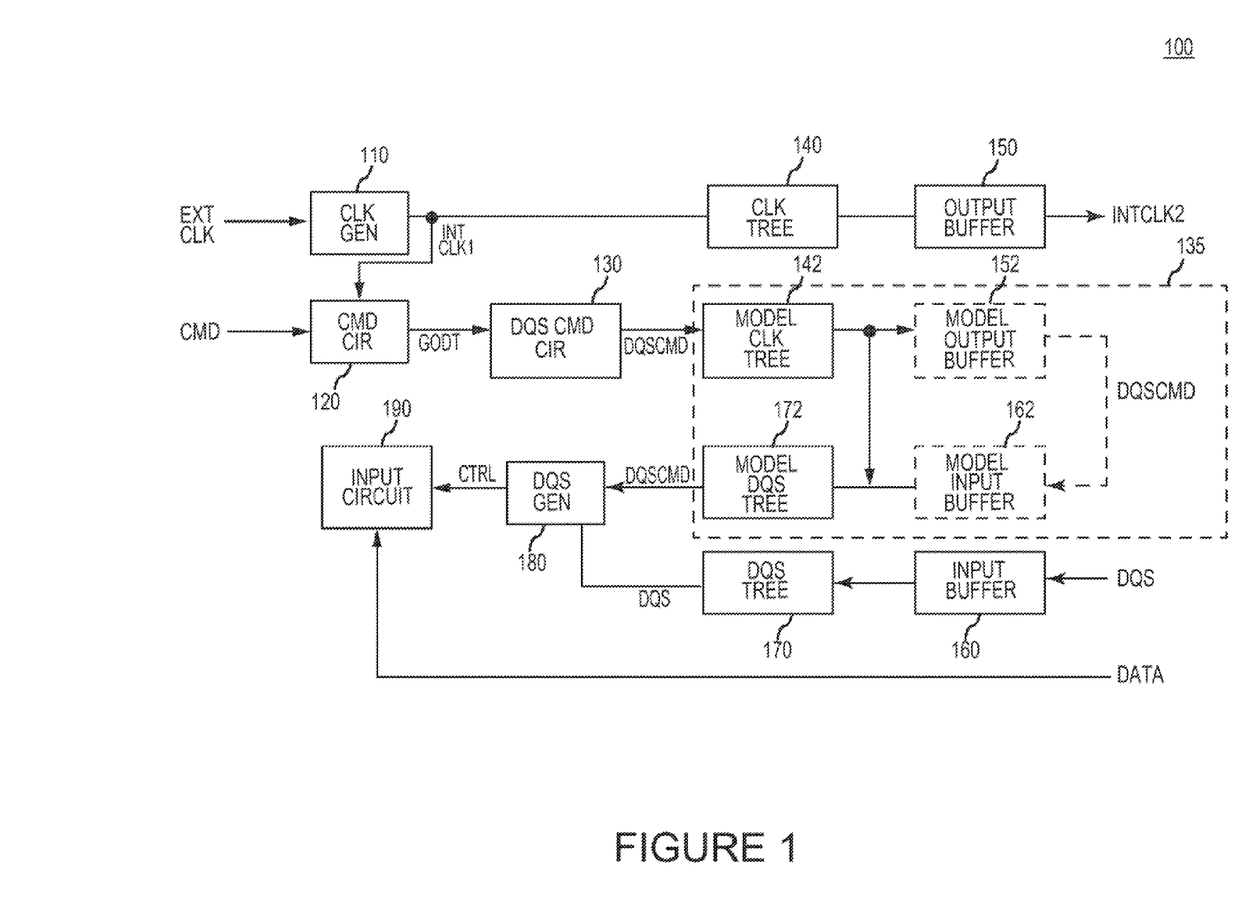
FIG. 1 is a simplified block diagram of clock and command paths according to an embodiment of the disclosure.

FIG. 1 illustrates an apparatus 100 (e.g., an integrated circuit, a memory device, a memory system, an electronic device or system, a smart phone, a tablet, a computer, a server, etc.) including a command path delay 135 according to an embodiment of the disclosure. The command path delay 135 may be configured to provide an internal command signal DQSCMD, which is in the time domain of a first internal clock signal INTCLK1 and delayed via the command path delay 135, with timing to match receipt of a data strobe signal DQS at the DQS generator 180.

The apparatus 100 may include a clock generator 110 that provides the INTCLK1 signal based at least in part on an external clock signal EXTCLK. The clock generator 110 may provide the INTCLK1 signal to an output of the output buffer 150 via the clock tree 140. The clock tree 140 may distribute the INTCLK1 signal to various circuits in the memory. The INTCLK1 signal may be delayed relative to the EXTCLK signal such that timing of the INTCLK2 signal at an output of the output buffer 150 is aligned with an edge of the EXTCLK signal. Thus, the clock generator 110 may delay the EXTCLK signal based at least in part on the inherent, asynchronous delay of the clock tree 140 and the output buffer 150. The clock generator 110 may include a delay-locked loop (DLL) circuit, and the INTCLK1 signal may be in the DLL domain. The DLL circuit may provide a variable delay to the EXTCLK signal based on process, voltage, and temperature changes or differences.

The apparatus 100 may include a command circuit 120 that receives a command CMD and propagates the CMD command based at least in part on the timing of the INTCLK1 signal to provide a internal command signal (GODT) in the internal clock time domain. In providing the GODT command, the command circuit 120 transitions the CMD command from the EXTCLK signal time domain to the INTCLK1 signal time domain as the GODT command. In some examples, the GODT signal may be a global dynamic on-die termination signal that includes the write command and CAS write latency information.

The command circuit 120 may provide the GODT command to a DQS command circuit 130. Based at least in part on (e.g. responsive to) the GODT command, the DQS command circuit 130 may provide the DQSCMD signal to the command path delay 135. The DQSCMD signal may have a pulse width that is equal to half of a number of data bits in a data burst associated with the CMD command (e.g., 4 tCK for an 8-bit burst of data). The DQS command circuit 130 may delay the start of the pulse of the DQSCMD signal by a predetermined number of INTCLK1 signal clock periods (tCKs) relative to the GODT command. In some embodiments, the predetermined number INTCLK1 signal tCK period is 2.5 tCK. The command path delay 135 may provide a delayed DQSCMD signal to a DQS generator 180, which may be configured to provide a control signal CTRL to an input circuit 190.

The apparatus 100 may further include an input buffer 160 configured to receive a DQS signal and provide the DQS signal to a DQS tree 170. The DQS tree 170 may be configured to distribute the DQS signal to various circuits of the memory. The DQS tree 170 may provide the DQS signal to the DQS generator 180. Data DATA (e.g., write data to be written to memory) may be provided to the input circuit 190. The input circuit 190 may be configured to capture the DATA associated with a received CMD command according to the CTRL signal provided by the DQS generator 180. The input buffer 160 and DQS tree 170 may have inherent, asynchronous propagation delays. The input circuit 190 may include input buffers and other circuitry for capturing the DATA from a data bus.

As previously described, the apparatus 100 may include the command path delay 135 coupled to the DQS command circuit 130 and the DQS generator 180. The command path delay 135 may be modeled such that the DQSCMD signal is propagated through the command path delay 135 to the DQS generator 180 coincident with the DQS signal being received at the DQS generator 180. Thus, the command path delay 135 may be modeled after the inherent, asynchronous propagation delays corresponding to propagation of the DQS and INTCLK1 signals. For example, the command path delay 135 may include a model clock tree 142 having a delay modeled after the delay of the clock tree 140, and may further include a model DQS tree 172 having a delay modeled after the delay of the DQS tree 170. In some embodiments, the DQSCMD signal may be provided through the model clock tree 142 and the model DQS tree 172 to the DQS generator 180. In other embodiments, the command path delay 135 may further include a model output buffer 152 having a delay modeled after the delay of the output buffer 150 and a model input buffer 162 having a delay modeled after the delay of the input buffer 160. The DQSCMD signal may be provided through the model clock tree 142, model output buffer 152, model input buffer 162, and model DQS tree 172 to the DQS generator 180.

In operation, the apparatus 100 may receive a CMD command, a DQS signal, and DATA, that are each associated with a memory access operation. The CMD command, DQS signal, and DATA may each be provided, for example, by a memory controller (not shown). In some embodiments, the CMD command may be a write command. In some memory access operations, a latency (e.g., column address strobe (CAS) write latency (CWL)) between receipt of the CMD command and receipt of the associated data may be set. The latency may be defined by number of clock cycles tCK and may allow some time for the apparatus 100 to process the CMD command and prepare circuitry of the apparatus 100 for capturing data prior to receiving the DATA. The CMD command may be received according to timing of the EXTCLK signal (e.g., a system clock), and the DATA may be received according to timing of the DQS signal. In some embodiments, timing of the DQS signal and timing of the EXTCLK signal may be within of a ¼ tCK to provide a timing margin (e.g., tDQSSmin and tDQSSmax). As known, electronic circuitry has inherent, asynchronous propagation delays, which may result in signal delays as a signal is received and provided by the electronic circuitry. In order to account for the inherent, asynchronous propagation delays, the clock generator 110 may provide the INTCLK1 signal having such timing so that the INTCLK1 signal at an output of the output buffer 150 is aligned with the EXTCLK signal. This may allow downstream circuitry (not shown) to operate in synchronization with timing of the EXTCLK signal.

The apparatus 100 may take advantage of the INTCLK1 signal alignment with the EXTCLK at the output of the output buffer 150 to generate a DQSCMD signal having timing that is also aligned with the EXTCLK signal at the output of the model output buffer 152. For example, the command circuit 120 may retime the CMD command in the INTCLK1 domain to provide the GODT command. As explained above, the apparatus 100 may be operating under a selected CWL. The command circuit 120 may be configured to provide the GODT command based at least in part on the selected CWL. The relationship between the timing of the GODT command and receipt of the data is such that, if the GODT command were propagated to the output of the model output buffer 152, it would arrive approximately 3 clock cycles prior to the DQS signal arriving at the input buffer 160. The determination of the 3 clock cycles may be dependent on the CWL. The DQS command circuit 130 may provide the DQSCMD signal having a defined synchronous delay relative to the GODT command (e.g., 2.5 tCK). Thus, in an example, the DQSCMD signal may arrive at the output of the model output buffer 152 half of a clock cycle prior to the DQS signal arriving at the input buffer 160. The DQSCMD signal may have a pulse width in tCK equal to half a number of bits in the data burst associated with the CMD command. For example, if the number of bits in the data burst is 8, then the DQSCMD signal pulse width is 4 tCK of the INTCLK1 signal.

In an example operation, it will be assumed that there is a nominal condition in which the DQS signal timing matches the EXTCLK signal timing (e.g., tDQSSnom). As a result, providing the DQSCMD signal from the model output buffer 152 to the model input buffer 162 and receiving the DQS signal at the input buffer 160 may result in the DQSCMD signal and the DQS signal arriving at the DQS generator 180 with the DQSCMD command half of a tCK ahead of the DQS signal. The propagation delay through the model input buffer 162 and the model DQS tree 172 may be approximately equal to the propagation delay of the input buffer 160 and the DQS tree 170. However, as previously explained, the DQS signal timing may lead or lag the EXTCLK signal timing by up to ¼ tCK (e.g., tDQSSmin to tDQSSmin). To account for the possibility of the EXTCLK signal lagging the DQS signal by ¼ tCK, in some embodiments the DQSCMD signal may bypass the model output buffer 152 and the model input buffer 162, and be provided from the model clock tree 142 to the model DQS tree 172. This will result in a reduction in the propagation delay provided to the DQSCMD signal by the command delay path 135.

Responsive to receipt of the DQSCMD signal and the DQS signal, the DQS generator 180 may provide the CTRL signal to the input circuit 190 to capture the data responsive to transitions of the DQS signal.

Figure 2:
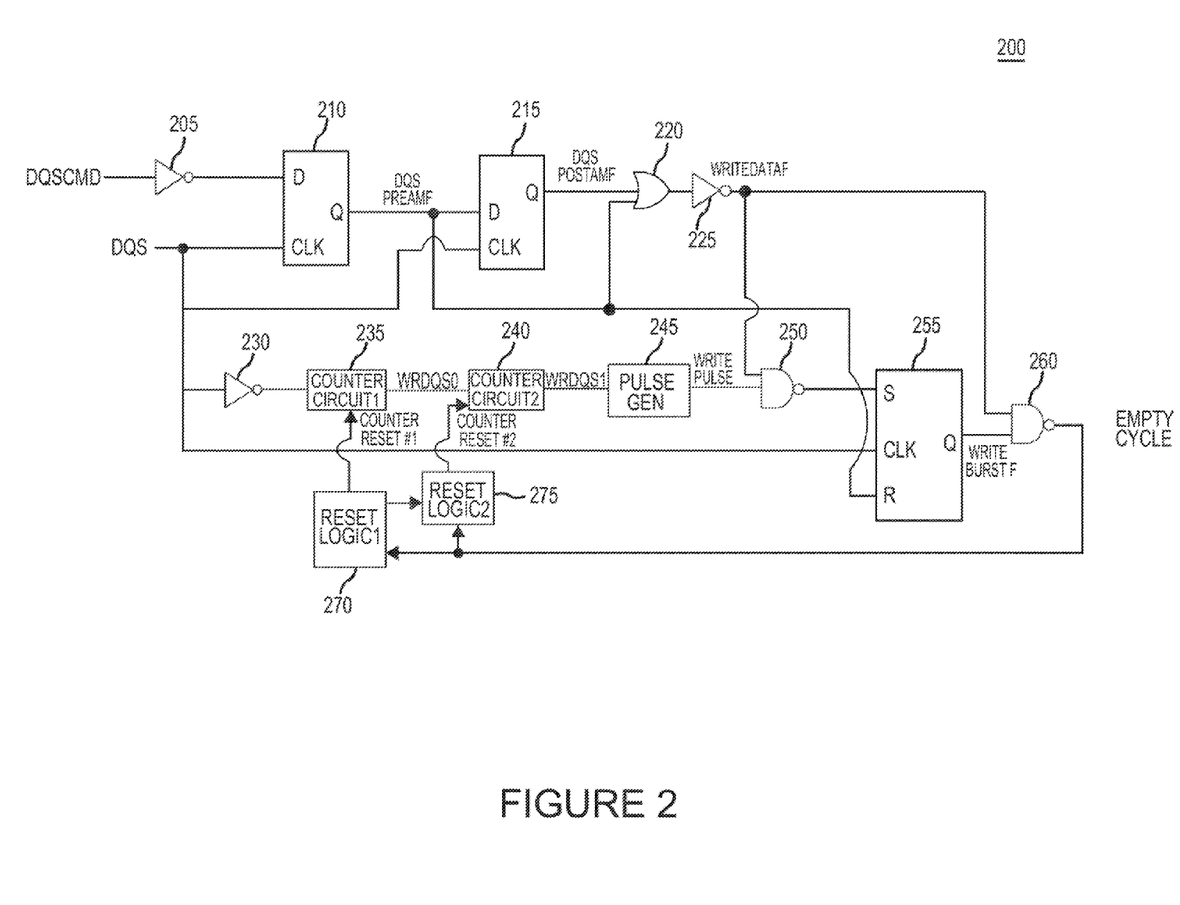
FIG. 2 is a simplified block diagram of a data strobe generator circuit according to an embodiment of the disclosure.

FIG. 2 illustrates an exemplary control signal circuitry 200 of a data strobe generator circuit according to an embodiment of the disclosure. The control signal circuitry 200 may be included, for example, in the DQS generator 180 of FIG. 1. The control signal circuitry 200 may provide control signals to an input circuit, for example the CTRL signal to the input circuit 190 of FIG. 1, that may be used to capture data provided from a memory controller (not shown) during a memory access operation. The control signal circuitry 200 may include an inverter 205 coupled to a latch 210. The latch 210 may be coupled to a latch 215. Each of the latch 210 and the latch 215 may be clocked by the data strobe signal DQS. The latch 210 may provide an inverted DQSCMD signal as a preamble command signal DQSPRE-AMF, and the latch 215 may provide the DQSPREAMF signal delayed by ½ tCK as a postamble command signal DQSPOSTAMF signal. The DQSPREAMF signal may have a pulse width of half a count of data bits D0-7 (e.g., 4 tCK), and may start ½ tCK before a DQS clock cycle associated with data bit D0 and end at a DQS clock cycle associated with data bit D7. The DQSPOSTAMF signal may have a pulse width of half a number of data bits D0-7 (e.g., 4 tCK), and may start at a DQS clock cycle associated with data bit D0 and end ½ tCK after a DQS clock cycle associated with data bit D7.

The DQSPREAMF and DQSPOSTAMF signals may be provided to an OR gate 220, with an output of the OR gate 220 provided through an inverter 225 to provide a WRITE-DATAF signal. The WRITEDATAF signal may identify DQS clock cycles associated with data bits D0-D7.

The DQS signal may also be provided to a first counter circuit 235 via an inverter 230. The first counter circuit 235 may be coupled to a second counter circuit 240, and an output of the second counter circuit 240 may be provided to a pulse generator 245. The inverter 230 may invert the DQS signal to provide a counter clock signal to the first counter circuit 235. Each of the first counter circuit 235 and second counter circuit 240 may count a respective nibble of the data bits D0-7, with the first counter circuit 235 counting a first nibble D0-D3 and the second counter circuit 240 counting a second nibble D4-D7. The first counter circuit 235 may set a WRDQS0 signal responsive to completing the count of the first nibble D0-3, and the second counter circuit 240 may set a WRDQS1 signal responsive to completing the count of the second nibble D4-7. Thus, the WRDQS0 signal is used to capture the first nibble D0-D3 and the WRDQS1 signal is used to capture the second nibble D4-D7. In an example where the burst length is four bits, the WRDQS0 signal may be provided directly to the pulse generator 245. In some examples, the control signal circuitry 200 may include a multiplexer that receives each of the WRDQS0 and WRDQS1 signals and provides one of them to the pulse generator 245 based on a burst length selection. The second counter circuit 240 may begin counting the second nibble responsive to the WRDQS0 signal received from the first counter circuit 235. The pulse generator 245 may generate a write pulse responsive to a signal from the second counter circuit 240 that is provided based at least in part on the second counter circuit 240 completing a count of the second nibble D4-7 (e.g., indicating that a clock cycle associated with the last data bit D7 has been received).

The write pulse and the WRITEDATAF signal may each be provided to a NAND gate 250. The output of the NAND gate 250 may be provided to a flip flop 255. The flip flop 255 may also receive the DQSPREAMF signal from the output of the latch 210. The flip flop 255 may be clocked by the DQS signal to provide a WRITEBURSTF signal. The WRITEBURSTF signal may have a first edge of a pulse that is set based at least in part on a transition of the DQSPRE-AMF signal and may have a second edge that is set based at least in part on the write pulse signal. The WRITEBURSTF signal and the WRITEDATATF signal may be provided to a NAND gate 260, and an EMPTY CYCLE signal may be provided from an output of the NAND gate 260 to the first reset logic 270, and the second reset logic 275. The first reset logic 270 may reset the first counter circuit 235 and the second reset logic 275 may reset the second counter circuit 240.

In some embodiments, the DQS signal is a continuous signal, and consecutive write commands may be separated by a number of empty clock cycles of the DQS signal (e.g., 4 tCK). The control signal circuitry 200 may include logic that prevents the input circuit from capturing data between consecutive memory access commands. For example, the EMPTY CYCLE signal may be used by the first reset logic 270 and second reset logic 275 to ensure that the first counter circuit 235 and second counter circuit 240, respectively, are held in a reset state (e.g., and not counting) during the empty clock cycles, and only begin counting when one or both of the WRITEBURSTF or WRITEDATAF transition to a low logical value. The combination of the WRITEBURSTF and the WRITEDATAF signals may be used by the DQS generator to detect a window of clock cycles of the DQS signal that are associated with the data bits D0-D7, and may be used to provide control signals to input circuitry, such as the CTRL signal to the input circuit 190 of FIG. 1, to capture the data bits D0-D7.

The control signal circuitry 200 depicted in FIG. 2 is exemplary, and it will be appreciated that control signal circuitry may be implemented using an alternative architecture or circuitry. Further, the control signal circuitry 200 uses a burst length of 8 data bits, but it will be appreciated that a burst length could be more or less than 8 bits, and the first counter circuit 235 and second counter circuit 240 may each be coupled to the pulse generator 245 to generate write pulses when the burst length is 4 bits.

Figure 3:
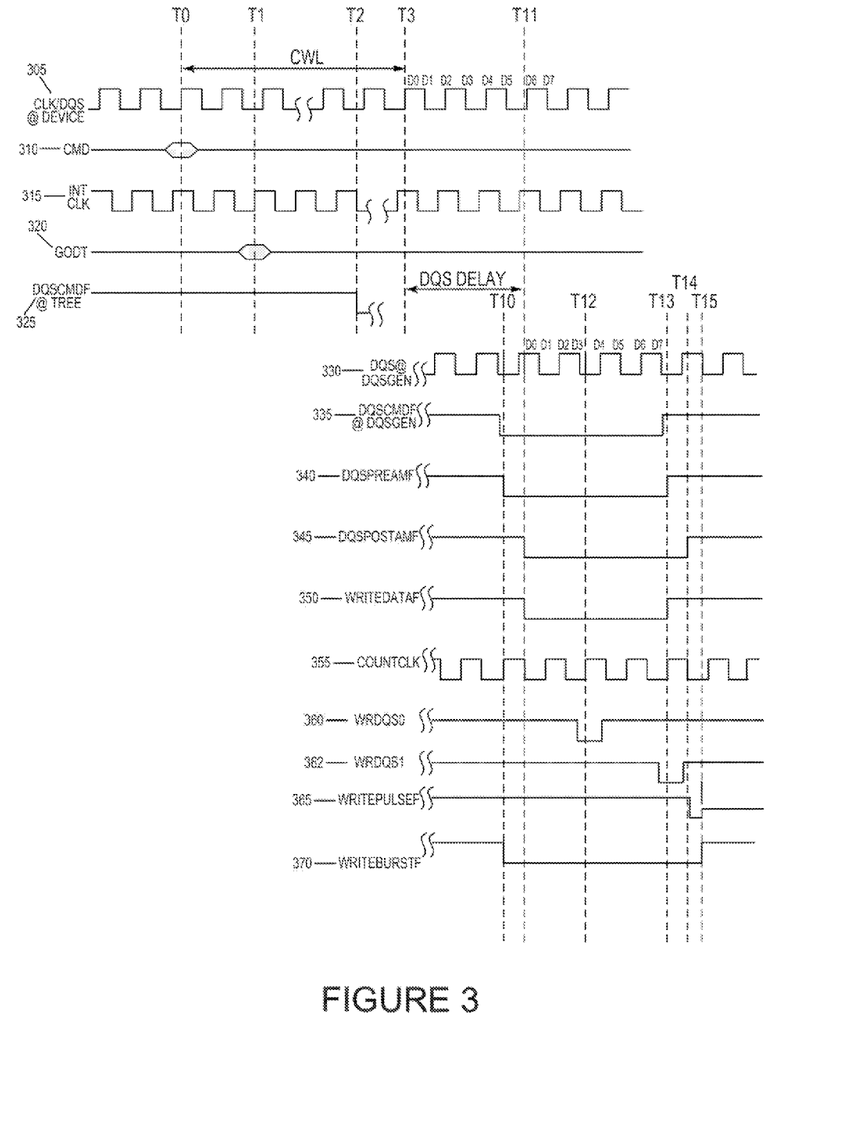
FIG. 3 is a timing diagram of various signals during operation of the clock and command paths of FIGS. 1 and 2 according to an embodiment of the disclosure.

FIG. 3 is an exemplary timing diagram depicting various signals propagating through circuitry of the apparatus 100 of FIG. 1 and/or the circuitry of the 200 of FIG. 2. The CLK/DQS at device signal 305 may represent a combination of the EXTCLK signal and the DQS signal being received at the clock generator 110 and the input buffer 160, respectively, of FIG. 1. The CMD command 310 may represent the CMD command received at the command circuit 120 of FIG. 1. The INTCLK signal 315 may represent the INTCLK1 signal being provided at an output of the clock generator 110. The GODT command may represent the GODT command being provided from the command circuit 120 of FIG. 1. The DQSCMDF signal at tree 325 may represent the DQSCMDF signal being provided at an output of the DQS command circuit 130 of FIG. 1. The DQS at DQSGEN 330 and the DQSCMDF (e.g., the complementary signal of the DQSCMD signal) at DQSGEN 335 may represent the DQS signal and the DQSCMDF signal, respectively, being received at the DQS generator 180 of FIG. 1. The DQSPREAMF 340, DQSPOSTAMF 345, WRITE-DATAF 350, counter clock 355, WRDQS0 360, WRDQS1 362 WRITEPULSEF 365, and WRITEBURSTF 370 may represent signals generated internally at the DQS generator 180 of FIG. 1 and/or the 200 of FIG. 2 to facilitate capturing of the data received at the input circuit 190.

At time T0, the CMD command 310 may be received coincident with an edge of the CLK/DQS at device 305. At time T1, the GODT command may be provided from the command circuit 120 of FIG. 1. The GODT command may be based at least in part on the CMD command 310 received at time T1, but retimed in the INTCLK signal 315 clock domain, rather than the CLK/DQS domain. At time T2, the DQSCMDF signal at tree 325 may toggle to a logical low value based at least in part on the GODT command 320. The DQS command circuit 130 of FIG. 1 may apply a synchronous delay (e.g., synchronous with the INTCLK signal 315) to the GODT command 320 to provide the DQSCMDF signal at tree 335. In some examples, the synchronous delay may be 2.5 tCK periods of the INTCLK signal 315. At time T3, the CLK/DQS at device 305 clock edge associated with the first data bit D0 may arrive at the device (e.g., at the input buffer 160 of FIG. 1).

Just before time T10, the DQSCMDF signal at DQSGEN 335 may toggle to a logical low value at the DQS generator 180 of FIG. 1. The DQSCMDF signal at DQSGEN 335 may represent the DQSCMDF signal at tree 325 with the asynchronous delay through the command path delay 135 of FIG. 1. The DQSCMDF signal at DQSGEN 335 may remain at the low logical value until time T13. At time T11, the rising clock edge of the DQS at DQSGEN 330 associated with the first data bit D0 may arrive at the DQS generator 180, and at time T13, the falling clock edge associated with the last data bit D7 may arrive at the DQS generator 180. The delay between time T3 and T11 may represent the DQS delay (e.g., delay through the input buffer 160 and DQS tree 170 of FIG. 1). The DQSCMDF signal at DQSGEN 335 may toggle to the logical low value approximately ½ tCK before the rising clock edge of the DQS at DQSGEN 330 associated with the first data bit D0, and may toggle to the logical high value at approximately the falling clock edge of the DQS at DQS-GEN 330 associated with the last data bit D7 (e.g., at time T13). The time duration between T10 and T13 at which the DQSCMDF signal at DQSGEN 335 remains at the logical low value may be equal to half a number of data bits tCK periods (e.g., 8/2=4 tCK).

The DQSPREAMF 340 may track the value of the DQSCMDF signal at DQSGEN 335, and the DQS-POSTAMF 345 may track the value of the DQSCMDF signal at DQSGEN 335 with a ½ tCK synchronous delay. Thus, in this example, the DQSPREAMF 340 may toggle to the logical low value at time T10 and may return to the logical high value at time T13. The DQSPOSTAMF 345 may toggle to the logical low value at time T11 and may return to the logical high value at time T14. The WRITE-DATAF 350 may represent a logical OR of the DQSPRE-AMF 340 and DQSPOSTAMF 345 to indicate a window in which clock edges of the DQS at DQSGEN 330 associated with the data bits D0 to D7 are received at the DQS generator 180.

The counter clock 355 may be an inverted DQS clock signal received at the output of the inverter 230 of FIG. 2. The WRDQS0 360 and WRDQS1 362 signals may represent the WRDQS0 and WRDQS1 signals provided from the first counter circuit 235 and second counter circuit 240 of FIG. 2 to indicate the first nibble and the second nibble. At time T12, the WRDQS0 360 may be a low logical value coincident with the falling clock edge of the DQS at DQSGEN 330 associated with data bit D3 (e.g., the WRDQS0 signal indicating completion of the first nibble), and at time T13, the WRDQS1 362 may be a low logical value coincident with the falling clock edge of the DQS at DQSGEN 330 associated with data bit D7 (e.g., the WRDQS1 signal indicating completion of the second nibble). After time T13, responsive to the WRDQS1 362 returning to a logical high value, the WRITEPULSEF 365 may generate a pulse to indicate the end of the clock cycles of the DQS at DQSGEN 330 associated with the data bits D0-D7. As described with reference to FIG. 2, the WRITEBURSTF 370 may have a pulse that starts at time T10 with a transition to a low logical value based at least in part on the DQSPREAMF 340, and, at time T15, transitions to a logical high value responsive to a rising edge of the WRITEPULSEF 365.

The timing diagram 300 is exemplary, and relative timing between signals may vary from the relative timing depicted. In some memory systems, CWL may vary based on the tCK. This may be due to the fact that the inherent latency through circuit components of a memory system is asynchronous, and as a result, the CWL defined in terms of tCK will vary based on the clock frequency. Thus, the higher the clock frequency, and consequently the shorter the time for one tCK, the greater the number of clock cycles necessary to compensate for the inherent latency. Additionally, memory systems may need a minimum amount of setup time to prepare to capture write data from a memory controller responsive to being notified of an impending receipt of the write data. Therefore, the apparatus 100 of FIG. 1 may be constrained to clock frequency ranges based on the timing difference between the internal clock signal and the external clock signal (second time measurement TM2) (e.g., the amount of delay provided by the clock generator 110 of FIG. 1) (not shown in FIG. 3), and the DQS delay (first time measurement TM1) (e.g., delay between T3 and T1 of FIG. 3). In some embodiments, TM1 must be greater than TM2. Assuming a minimum setup time of X, and the timing variance between the external clock being no greater than ¼ tCK, minimum and maximum tCK may be calculated.

The tCKMAX (e.g., lowest-frequency) may be calculated based on a worst case scenario when the DQS signal leads the external clock signal by tCK. For example, assuming that the DQS clock leads the external clock signal by ¼ tCK, the tCKMAX may be calculated as follows:

$$(TM1-tCK/4)-TM2>=X \rightarrow tCKMAX<=4*(TM1-TM2)-4X$$

where X is the setup time of the capturing flip-flop. The tCKMIN (e.g., highest frequency) may be calculated based on a worst case scenario when the DQS signal lags the external clock signal by ¼ tCK. For example, assuming that the DQS clock lags the external clock signal by ¼ tCK, the tCKMIN may be calculated as follows:

$$TM2>=-tCK+tCK/4+TM1+Y \rightarrow tCKMIN<=4*(TM1+Y-TM2)/3$$

where Y is a setup time of a capturing flip-flop. The CWL may be configurable, with each CWL setting designed to operate between minimum and maximum tCKs. As previously explained, the tCKMIN and tCKMAX are functions of (TM1-TM2). Thus, the (TM1-TM2) ratio may be adjusted by adding a small delay to TM2 to increase to decrease the (TM1-TM2) value for operation at higher frequencies.

Assuming the setup time of X is equal to 0.2 ns, the following table illustrates a non-limiting example of adjusting the (TM1-TM2) value for different tCK period ranges:

| CWL | MIN SPEC VALUE/ TAR MIN CIR VALUE | MAX SPEC VALUE/TAR MAX CIR VALUE | Target (TM1 − TM2) Delay | Added Delay |
|---|---|---|---|---|
| 5 | 2.5 ns/2 ns | 3.3 ns/5 ns | 1.5 ns | None |
| 6 | 1.875 ns/1.37 ns | 2.5 ns/3.3 ns | 1.025 ns | 1.5 − 1.025 = 0.475 ns (~6 gate delays) |
| 7 | 1.5 ns/1.1 ns | 1.875 ns/2.5 ns | 0.825 ns | 1.5 − 0.825 = 0.675 ns (~8 gate delays) |
| 8 | 1.25 ns/0.9 ns | 1.5 ns/1.875 ns | 0.67 ns | 1.5 − 0.67 = 0.83 ns (~10 gate delays) |
| 9/10 | 0.94 ns/0.77 ns | 1.5 ns/1.5 ns | 0.58 ns | 1.5 − 0.58 = 0.92 ns (~12 gate delays) |

The exemplary target minimum and maximum values may provide sufficient operating margins for the respective specified minimum and maximum values. The target (T1-T2) delay may be determined by using the target maximum circuit value into tCK Max equation and solving for (TM1-TM2). The tCKMIN value may be determined by plugging the target (TM1-TM2) value into the tCKMIN equation. The added asynchronous delay for CWL6-10 may be determined by subtracting respective target (TM1-TM2) delay from the CWL5 target (TM1-TM2) delay. The added asynchronous delay may be introduced in the path for the DQSCMD signal.

Figure 4:
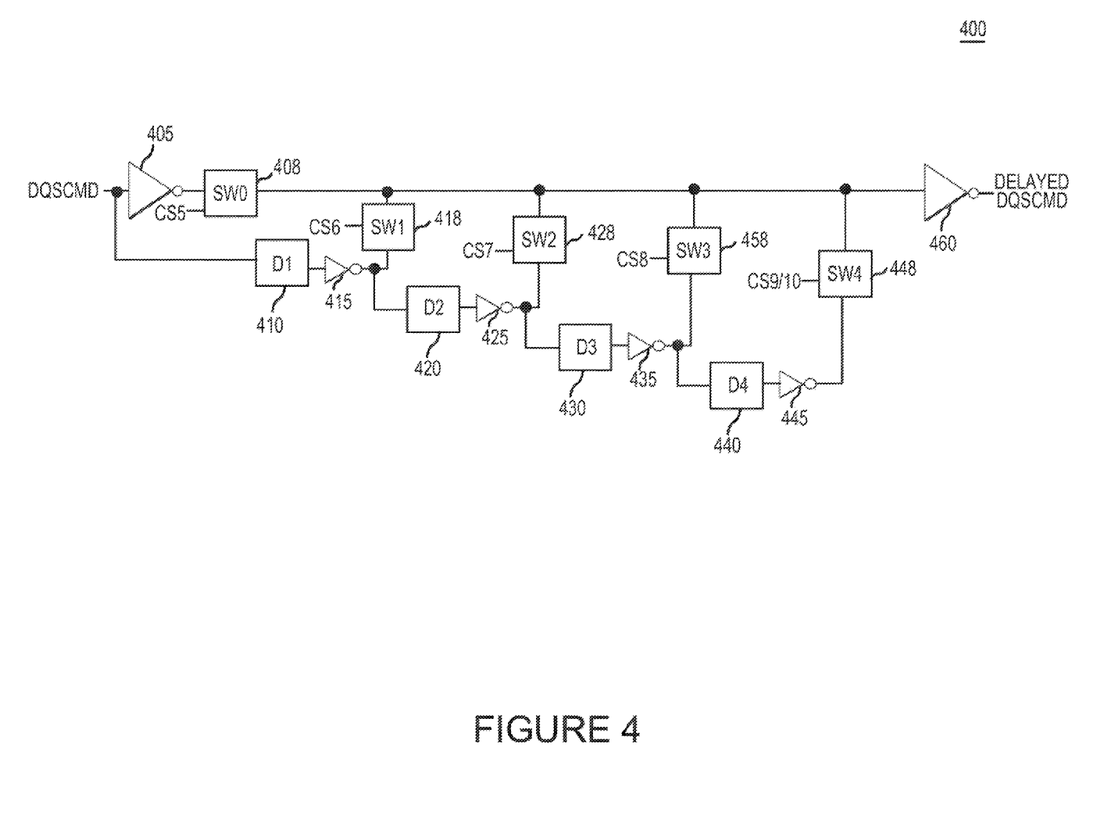
FIG. 4 is a simplified block diagram of a command path delay circuit according to an embodiment of the disclosure.

FIG. 4 illustrates an exemplary delay circuit 400 that may be used to introduce the additional delay to the DQS command signal according to an embodiment of the disclosure. The delay circuit 400 may be implemented in the model clock tree 142, model DQS tree 172, the model output buffer 152, the model input buffer 162 of FIG. 1, or a combination thereof. The exemplary delay circuit 400 may include a series of cascading delays D1-D4 410, 420, 430, and 440, (and corresponding inverters 415, 425, 435, and/or 445) and corresponding switches 408, 418, 428, 438, and 448. The switches S0-S4 408, 418, 428, 438, and 448 may be controlled via CWL select CS5-9/10 control signals. The CS5-9/10 control signals may correspond to CWL5-9/10 selections, respectively.

In operation, the DQSCMD signal may be provided to the switch S0 408 via the inverter 405 and to the delay D1 410. Responsive to the CS5 control signal being enabled, the switch S0 408 may be enabled to provide the DQSCMD signal directly to the inverter 460, which may provide the delayed DQSCMD signal with little or no added delay relative to the DQSCMD signal. Responsive to one of the other CS6-9/10 being enabled, the DQSCMD signal be provided through one or more respective gate delays D1-D4 410, 420, 430, and/or 440. The switch S1-S4 418, 428, 438, or 448 associated with the enabled CS6-9/10 signal may be enabled to provide the DQSCMD signal to the inverter 460. For example, responsive to CS8 being enabled, the DQSCMD signal may be provided through delay D1 410 (and inverter 415), delay D2 420 (and inverter 425), and delay D3 430 (and inverter 435). Switch S3 438 may be enabled via the CS8 control signal to provide the DQSCMD signal to the inverter 460. In some embodiments, only a single CS5-9/10 control signal may be enabled at a given time. As previously described, adjusting the delay may alter the (T1-T2) value to adapt the apparatus 100 for operation in different tCK period ranges.

It will be appreciated that the exemplary delay circuit 400 may be implemented using other delay architectures. The 400 may also include fewer or more cascading delays than the delays D1-D4 410, 420, 430, and 440 shown in FIG. 4.

Figure 5:
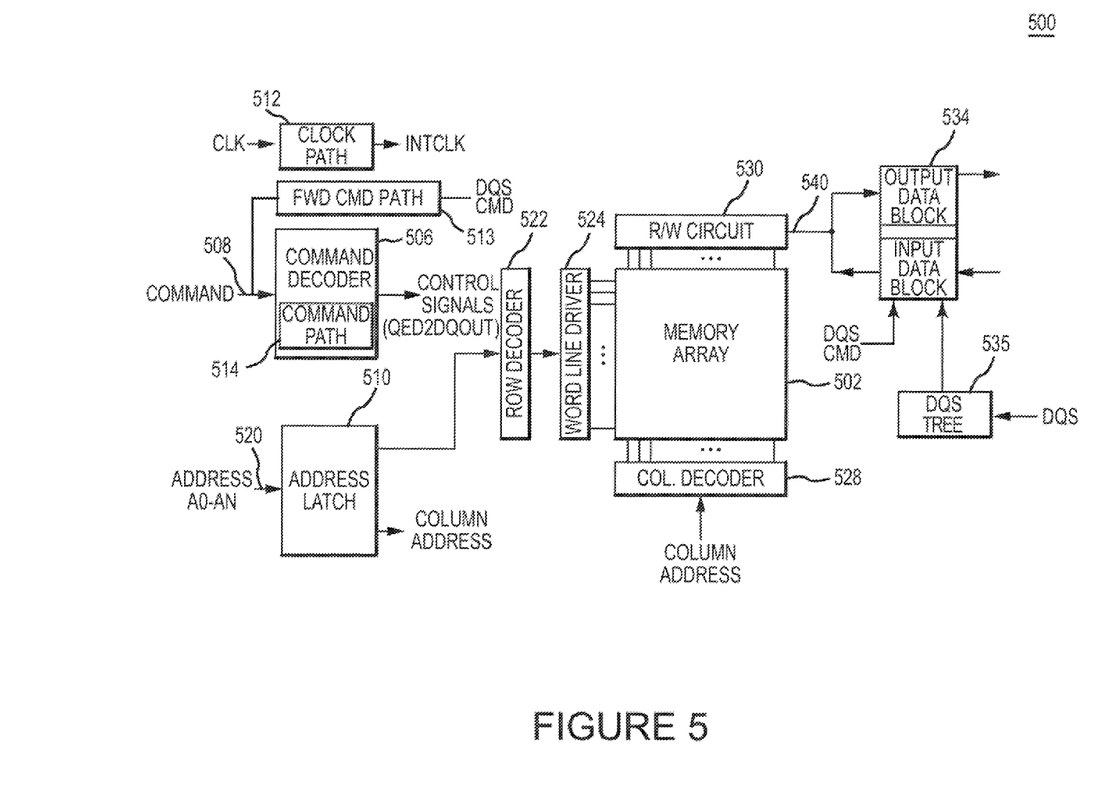
FIG. 5 is a simplified block diagram of a memory including clock and command paths according to an embodiment of the disclosure.

FIG. 5 illustrates a portion of a memory 500 according to an embodiment of the present disclosure. The memory 500 includes an array 502 of memory cells, which may be, for example, volatile memory cells (e.g., DRAM memory cells, SRAM memory cells), non-volatile memory cells (e.g., flash memory cells), or some other types of memory cells. The memory 500 includes a command decoder 506 that receives memory commands through a command bus 508 and provides (e.g., generates) corresponding control signals within the memory 500 to carry out various memory operations. Row and column address signals are provided (e.g., applied) to the memory 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to an input/output data block 534 via an input-output data bus 540. Write data are provided to the memory array 502 through the I/O data block 534 and the memory array read/write circuitry 530. The I/O data block 534 may include clocked circuitry that operate responsive to an internal clock signal INTCLK and an internal command signal DQSCMD, for example. In some embodiments, the memory 500 may include a DLL circuit to generate the INTCLK signal.

The memory 500 further includes clock path 512 and forward command path 513. The clock path 512 receives an input clock signal CLK and propagates the internal clock signal INTCLK which is based at least in part on the CLK signal to the I/O data block 534. The forward command path 513 may be implemented using a command path according to an embodiment of the disclosure. For example, the forward command path 513 may include the command path delay 135 of FIG. 1, and/or the delay circuit 400 of FIG. 4. The forward command path 513 provides the DQSCMD signal to the I/O data block 534. The command decoder 506 responds to memory commands provided to the command bus 508 to perform various operations on the memory array 502. In particular, the command decoder 506 is used to provide internal control signals to read data from and write data to the memory array 502. The I/O data block 534 may also receive a data strobe signal DQS via a DQS tree 535. The DQS tree 535 may correspond to the DQS tree 170 of FIG. 1. The I/O data block 534 may include a DQS generator, such as the DQS generator 180 of FIG. 1, and/or the control signal circuit 200 of FIG. 2.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
    a command circuit configured to provide a command signal in an internal clock time domain based at least in part on a memory access command received in an external clock time domain;
    a command path delay configured to delay the command signal;
    a strobe generator circuit configured to receive the delayed command signal and a strobe signal, wherein a plurality of clock edges of the strobe signal correspond to received data associated with the memory access command, the strobe generator circuit configured to control input circuitry to capture the data associated with the memory access command based at least in part on the strobe signal and the delayed command signal, wherein the strobe generator circuit comprises logic configured to generate a pulse beginning at a clock edge of the strobe signal corresponding to a first bit of the data and ending at a clock edge of the strobe signal corresponding to a last bit of the data.

2. The apparatus of claim 1, wherein the strobe generator circuit comprises logic that prevents the input circuit from capturing data between consecutive memory access commands.

3. The apparatus of claim 1, wherein the strobe generator circuit comprises:
    a first latch configured to receive the delayed command signal and the strobe signal, the first latch configured to provide a preamble command signal at an output by propagating the delayed command signal through the first latch based at least in part on the strobe signal;
    a second latch configured to receive the preamble command signal from the first latch and the strobe signal, the second latch configured to provide a postamble command signal at an output by propagating the preamble command signal through the second latch based at least in part on the strobe signal; and
    a first logic gate configured to receive the preamble command signal and the postamble command signal, the logic gate configured to provide a write data signal at an output based at least in part on a logical OR comparison of the preamble command signal and the postamble command signal.

4. The apparatus of claim 3, further comprising:
    counter circuits configured to count clock edges of the strobe signal associated with bits of the data associated with the memory access command, the counter circuits configured to provide an output signal based at least in part on a count of bits in a burst of data;
    a pulse generator configured to provide a write pulse based at least in part on the output signal;
    a second logic gate configured to provide flip-flop input signal to at an output based at least in part on a NAND logic comparison between an the write pulse and an inverted value of the write data signal;
    a flip-flop configured to receive the write pulse and the preamble command signal, based at least in part on the strobe signal, the flip-flop configured to provide a write burst signal at an output based at least in part on the preamble command signal and the write pulse; and
    a third logic gate configured to provide an empty cycle signal at an output based at least in part on a NAND logic comparison between an inverted write data signal and the write burst signal; and
    reset logic circuits configured to receive the empty cycle signal and to prevent the counter circuits from counting responsive to the empty cycle signal having a value indicating an empty cycle.

5. The apparatus of claim 1, wherein the memory access command is a write command, and wherein the data is write data.

6. The apparatus of claim 3, wherein the command circuit is configured to generate the write data signal having a pulse width equal to a count of clock cycles of the internal clock equal to half a number of bits in a data burst.

7. The apparatus of claim 6, wherein the number of bits in the data burst is 8 bits and the pulse width is equal to 4 clock cycles of the internal clock or the number of bits in the data burst is 4 bits and the pulse width is equal to 2 clock cycles.

8. An apparatus, comprising:
    a command circuit configured to receive a memory access command in a time domain of an external clock signal, the command circuit configured to provide an internal command signal in a time domain of an internal clock signal, wherein the internal command signal includes a pulse having a width equal to a number of clock cycles of the internal clock signal equal to half of a number of bits of data associated with the memory access command, wherein the internal clock signal is delayed relative to the external clock signal based at least in part on a propagation delay a clock path;
    input circuitry configured to receive the data associated with the memory access command;
    a command delay path configured to delay the internal command signal, wherein the delay of the command delay path is based at least in part on the propagation delay through at least a portion of the clock path; and
    a data strobe generator circuit configured to receive the internal command signal delayed from the command delay path, the data strobe generator circuit further configured to receive a data strobe signal, wherein clock edges of the data strobe signal correspond to individual bits of the data, wherein the start of the pulse of the internal command signal is received at the data strobe generator circuit prior to a clock edge of the data strobe signal corresponding to a first bit of the data, the data strobe generator circuit configured to control the input circuitry to capture the data.

9. The apparatus of claim 8, further comprising a data strobe command circuit coupled between the command circuit and the command delay path, the data strobe command circuit configured to apply a synchronous delay to the internal command signal.

10. The apparatus of claim 8, further comprising a clock generator configured to delay the external clock signal to provide the internal clock signal; wherein the delay is based at least in part on a propagation delay through the clock path.

11. The apparatus of claim 10, further comprising:
    an input buffer configured to receive the data strobe signal; and
    a clock tree circuit configured to provide the data strobe signal from the input buffer to the data strobe generator circuit, wherein the delay through the command delay path is further based at least in part on a propagation delay through the clock tree circuit.

12. The apparatus of claim 11, wherein the delay through the command delay path is further based at least in part on the propagation delay through an output buffer and the propagation delay through the input buffer.

13. The apparatus of claim 8, wherein the delay through the command delay path is an asynchronous delay.

14. The apparatus of claim 8, wherein the command delay path is configured to delay the internal command signal such that the pulse of the internal command signal is received at the data strobe generator circuit between one-fourth of a clock cycle of the data strobe signal prior to receiving the clock edge of the data strobe signal corresponding to the first bit of the data and three-quarters of the clock cycle of the data strobe signal prior to receiving the clock edge of the data strobe signal corresponding to the first bit of the data.

15. The apparatus of claim 8, wherein the data strobe generator circuit comprises logic circuits configured to generate control signals based at least in part on the data strobe signal and the internal command signal, wherein the control signals are provided to the input circuit to capture the data.

16. The apparatus of claim 8, wherein the command delay path comprises a delay circuit configured to delay the memory access command signal based at least in part on a column address strobe write latency setting.

17. The apparatus of claim 16, wherein the delay circuit comprises:
a plurality of delays coupled together serially, wherein a first of the plurality of delays is configured to receive the internal command signal; and
a plurality of switch circuits, wherein a first of the plurality of switch circuits is configured to receive an inverted internal command signal, wherein each of the remaining switch circuits of the plurality of switch circuits are coupled to an output of a respective one of the plurality of delays, wherein one of the plurality of switch circuits is configured to be enabled to provide the internal command signal to an output based at least in part on the column address strobe write latency setting.

18. A method, comprising:
receiving a memory access command at a memory according to timing of an external clock signal;
generating the internal clock signal based at least in part on the external clock signal;
providing the internal clock signal through a first clock tree of the memory, wherein the command delay path has a delay that is based at least in part on a propagation delay of the first clock tree;
providing an internal command signal according to timing of the internal clock signal based at least in part on receipt of the memory access command;
providing the internal command signal through a command delay path of the memory wherein the command delay path has a delay that is based at least in part on a propagation delay of the first clock tree;
receiving the delayed internal command signal and a data strobe signal at a data strobe generator circuit of the memory;
providing the data strobe signal through a second clock tree prior to receiving the data strobe signal at the data strobe generator circuit, wherein the delay of the command delay path is further based at least in part on a propagation delay of the second clock tree; and
capturing data received at the memory based at least in part on the delayed internal command signal and the data strobe signal, wherein the data is associated with the memory access command.

19. The method of claim 18, further comprising applying a synchronous delay to the internal command signal prior to providing the internal command signal through the command delay path.

20. The method of claim 18, wherein providing the internal command signal through the command delay path of the memory comprises providing the internal command signal through a delay circuit prior to receiving the internal command signal at the data strobe generator circuit, wherein the delay through the delay circuit is based at least in part on the column address strobe write latency setting.

21. A method, comprising:
receiving an external clock signal at a memory;
receiving a memory access command at the memory based at least in part on the timing of the external clock signal;
providing an internal clock signal based at least in part on the external clock signal, wherein the internal clock signal is delayed relative to the external clock signal;
providing an internal command signal based at least in part on the memory access command and timing according to the internal clock signal;
receiving the internal command signal and a data strobe signal at a data strobe generator circuit of the memory, wherein clock edges of the data strobe signal correspond to bits of data associated with the memory access command; wherein the internal command signal is received at the data strobe generator circuit prior to a clock edge of the data strobe signal corresponding to the first bit of the data;
capturing the data at the memory based at least in part on the internal command signal and the data strobe signal; and
preventing capture of data received at a time between consecutive memory access commands, wherein preventing capture of data received at the time between consecutive memory access commands comprises preventing counters from counting clock edges of the data strobe signal.

22. The method of claim 21, further comprising generating a pulse of a write data signal, based at least in part on the internal command signal and the data strobe signal, wherein the pulse of the write data signal begins at a clock edge of the data strobe signal associated with the first bit of data and ending at a clock edge of the data strobe signal associated with a last bit of the data.

* * * * *